(12) United States Patent
Morse et al.

(10) Patent No.: US 9,674,984 B2
(45) Date of Patent: Jun. 6, 2017

(54) PLASTIC CHASSIS FOR LIQUID COOLED ELECTRONIC COMPONENTS

(71) Applicant: Cubic Corporation, San Diego, CA (US)

(72) Inventors: Robert Morse, Vista, CA (US); Mahyar Dadkhah, San Diego, CA (US); John McCague, Poway, CA (US)

(73) Assignee: Cubic Corporation, San Diego, CA (US)

( * ) Notice: Subject to any disclaimer, the term of this patent is extended or adjusted under 35 U.S.C. 154(b) by 0 days.

(21) Appl. No.: 15/191,164

(22) Filed: Jun. 23, 2016

(65) Prior Publication Data

US 2016/0381827 A1     Dec. 29, 2016

Related U.S. Application Data

(60) Provisional application No. 62/183,632, filed on Jun. 23, 2015.

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |
| *H01L 23/473* | (2006.01) |
| *H05K 9/00* | (2006.01) |
| *H01L 23/14* | (2006.01) |

(52) U.S. Cl.
CPC ....... *H05K 7/20254* (2013.01); *H01L 23/145* (2013.01); *H01L 23/473* (2013.01); *H05K 9/0081* (2013.01)

(58) Field of Classification Search
CPC ............ G06F 1/20; G06F 1/203; G06F 1/206; H05K 7/20254; H05K 7/20218; H05K 7/20263; H05K 7/20281
USPC .................................. 361/694–697, 701–703
See application file for complete search history.

(56) References Cited

U.S. PATENT DOCUMENTS

| | | | |
|---|---|---|---|
| 6,351,384 B1 * | 2/2002 | Daikoku .................. | F28F 3/02 165/80.3 |
| 9,362,202 B2 * | 6/2016 | Baba .................... | H05K 1/0272 |
| 2004/0035245 A1 | 2/2004 | Albert et al. | |
| 2004/0134549 A1 | 7/2004 | Albert | |

(Continued)

OTHER PUBLICATIONS

International Search Report and Written Opinion of PCT/US2016/039042 mailed on Sep. 9, 2016; all pages.

*Primary Examiner* — Anthony Haughton
(74) *Attorney, Agent, or Firm* — Kilpatrick Townsend and Stockton, LLP

(57) ABSTRACT

A system for mounting liquid cooled electrical components includes a plastic chassis having a plurality of mounting sites. The plastic chassis defines at least one fluid circuit that extends through at least a portion of a length of the plastic chassis. The at least one fluid circuit includes an inlet configured to receive a cooling fluid from a fluid source, an outlet configured to return the cooling fluid to the fluid source, and at least one fluid channel extending between the inlet and the outlet. The system also includes a plurality of electrical components. Each of the plurality of electrical components is coupled with one of the plurality of mounting sites. Each of the plurality of mounting sites is in contact with the at least one fluid channel.

18 Claims, 4 Drawing Sheets

(56) References Cited

U.S. PATENT DOCUMENTS

2015/0003012 A1\* 1/2015 Baba .................... H05K 1/0272
                                                                361/689
2015/0123663 A1   5/2015 Brusila \* cited by examiner

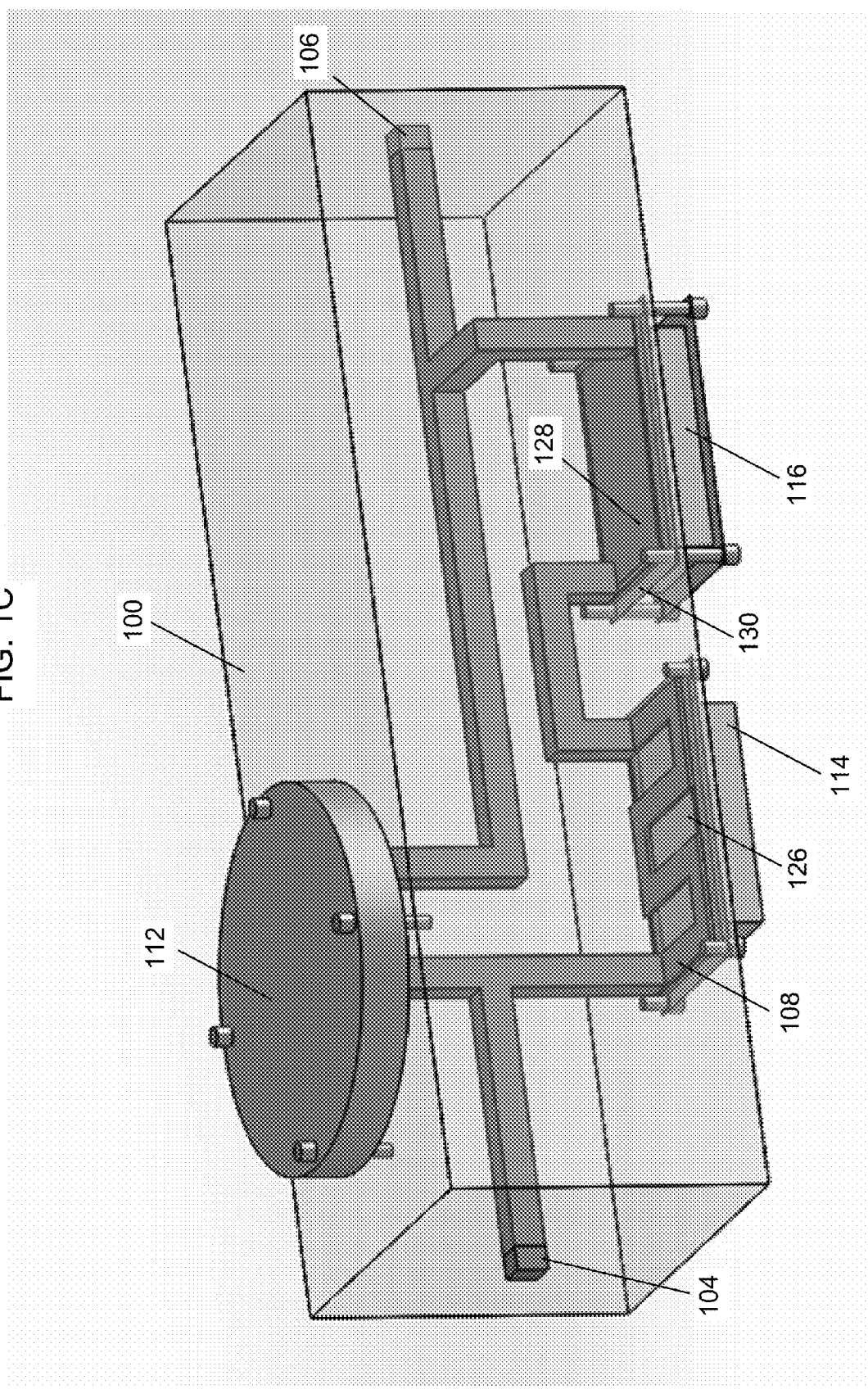

PLASTIC CHASSIS FOR LIQUID COOLED ELECTRONIC COMPONENTS

CROSS-REFERENCES TO RELATED APPLICATIONS

This Application claims priority to U.S. Provisional Patent Application No. 62/183,632 filed Jun. 23, 2015, entitled "PLASTIC CHASSIS FOR LIQUID COOLED ELECTRONIC COMPONENTS," the entire disclosure of which is hereby incorporated by reference, for all purposes, as if fully set forth herein.

BACKGROUND OF THE INVENTION

Electronic components often require a stable temperature to operate efficiently and effectively. Elevated operating temperatures reduce component efficiency and lifetime. Some electronic components also generate heat as they operate. This requires cooling to control component temperature. In traditional systems, heat is typically removed through local conduction and through convection to an external moving fluid. The assembly chassis is often made of metal and cooled by a liquid. This involves considerable weight and expense to machine the chassis and cooling channels.

Additional complications that arise with using a metal chassis because liquid cooling systems utilize a liquid that picks up heat from the hot components and then removes the heat from the chassis. That means the liquid should minimize contact with the chassis after it is heated by the hottest component. While designs may attempt to maximize thermal isolation, there is often a thermal loss as the heated liquid is cooled by the incoming liquid coolant.

Another complication is that a cooled metal chassis can also absorb heat from the environment rather than, or in addition to, absorbing heat from the heated components. This means that the liquid cooling system is cooling the entire equipment compartment rather than simply cooling an isolated electronic assembly, which reduces the efficiency and effectiveness of the liquid cooling system. Traditionally, to solve such problems designs thermally isolate a portion of the cooling system. This may be done by lining the coolant system with an insulating plastic sleeve. Other problems may arise with the use of metal chassis in conjunction with liquid cooling systems. For example, the metal chassis may be subjected to oxidation due to the presence of the liquid. This complication may also prevent the use of metal chassis in salty environments. A metal chassis may also be subject to galvanic corrosion where one metal corrodes preferentially to another when both metals are in electrical contact, in the presence of an electrolyte. Moreover, due to the density of various metallic alloys, a metal chassis may be very heavy.

BRIEF SUMMARY OF THE INVENTION

Embodiments of the present invention are directed to using a plastic to form the liquid cooled chassis. Plastic chassis allow cooling connections to be positioned almost anywhere on the chassis while reducing or even eliminating the concern for a thermal short between the inlet and the outlet. For example, the use of plastic chassis allows parallel, series, or mixed cooling circuits in the same chassis assembly. As the plastic serves as a strong insulator, there is little risk of a thermal short circuit between an inlet and outlet of a cooling conduit for one or more of the electronic components, even when positioned close together. Cooling conduits may be placed closer together, with inlets and outlets being separated by very small distances as heat from an outlet will largely be isolated within the outlet conduit and not radiate to an inlet where it would heat up incoming coolant fluids prior to the incoming fluids being used to cool a particular component. Characteristics of the insulating plastic provide numerous benefits over conventional metal chassis.

In one aspect, a system for mounting liquid cooled electrical components is provided. The system may include a plastic chassis that may have a plurality of mounting sites. The plastic chassis may define at least one fluid circuit that extends through at least a portion of a length of the plastic chassis. The at least one fluid circuit may include an inlet configured to receive a cooling fluid from a fluid source, an outlet configured to return the cooling fluid to the fluid source, and at least one fluid channel extending between the inlet and the outlet. The system may also include a plurality of electrical components. Each of the plurality of electrical components may be coupled with one of the plurality of mounting sites. Each of the plurality of mounting sites may be in contact with the at least one fluid channel.

In another aspect, a system for mounting liquid cooled electrical components includes a plastic chassis that may have a plurality of mounting sites. The plastic chassis may define at least one fluid circuit that extends through at least a portion of a length of the plastic chassis. The at least one fluid circuit may include an inlet configured to receive a cooling fluid from a fluid source, an outlet configured to return the cooling fluid to the fluid source, a first fluid channel, and a second fluid channel. The first fluid channel and the second fluid channel each may extend between the inlet and the outlet in a parallel configuration. The system may also include a plurality of electrical components. Each of the plurality of electrical components may be coupled with one of the plurality of mounting sites. Each of the plurality of mounting sites may be in contact with the at least one fluid channel.

In another aspect, a method for liquid cooling electrical components is provided. The method may include providing a plastic chassis that may have a mounting site. The plastic chassis may define a fluid circuit that extends through at least a portion of a length of the plastic chassis. The fluid circuit may include an inlet, an outlet, and a fluid channel extending between the inlet and the outlet, wherein the mounting site is in contact with the fluid channel. The method may also include coupling an electrical component to the mounting site and coupling the inlet and the outlet to a fluid source that is external to the plastic chassis. The method may further include introducing a cooling fluid from the fluid source to the inlet such that the cooling fluid passes through the fluid channel and contacts an inlet side of the mounting site where the cooling fluid cools the electrical component by absorbing heat from the electrical component before flowing past the mounting site on a return side of the mounting site. The heated cooling fluid may then exit the plastic chassis via the outlet and returning to the fluid source.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label

FIG. 1C depicts a top isometric view of the plastic chassis used in a liquid cooling application of FIG. 1A according to embodiments.

DETAILED DESCRIPTION OF THE INVENTION

Embodiments of the present invention are directed to using a plastic to form the liquid cooled chassis. This reduces the weight and cost of the chassis, while allowing several secondary problems to be solved. For example, a plastic chassis allows cooling connections to be positioned almost anywhere on the chassis while reducing or even eliminating the concern for a thermal short between the inlet and the outlet. A plastic chassis enables either direct convective cooling, indirect conductive cooling through an intermediate metal plate mounted on the chassis, or both. Direct cooling enables electronic components to be easily removed or installed on the plastic chassis without the need to apply an intermediate thermal paste. Plastic materials typically provide greater structural damping than metals, so a plastic chassis has reduced susceptibility to resonant vibration and fatigue.

Other benefits of using a plastic chassis for liquid cooled electronic components include the immunity of the plastic chassis to oxidation. Because of this immunity, plastic chassis do not require protective coatings and can operate in salty and/or humid environments. Plastics are typically electrical insulators, so a plastic chassis isolates metal parts from galvanic corrosion. Plastics have lower densities than most metal alloys, so the chassis itself may be much lighter than a metal chassis of similar size. Additionally, the plastics are typically easier to machine, mold, and/or otherwise form into chassis than metal alloys, especially in large volumes, which may save costs associated with labor and materials. Any plastic components of a chassis may be assembled using mechanical fasteners, solvent bonding, and/or other conventional coupling techniques. These characteristics make plastic chassis ideal for use in applications such as aircraft avionics, naval communications, antenna power amplifiers where there may be exposure to water, vibrations, excessive heat and other environmental challenges, although plastic chassis may be used in any applications that require liquid cooling solutions.

Importantly, the use of plastic chassis allows parallel, series, or mixed cooling circuits in the same chassis assembly. As the plastic serves as a strong insulator, there is little risk of a thermal short circuit between an inlet and outlet of a cooling conduit for one or more of the electronic components. Cooling conduits may be placed closer together, with inlets and outlets being separated by very small distances as heat from an outlet will largely be isolated within the outlet conduit and not radiate to an inlet where it would heat up incoming coolant fluids prior to the incoming fluids being used to cool a particular component.

Figure 1A:
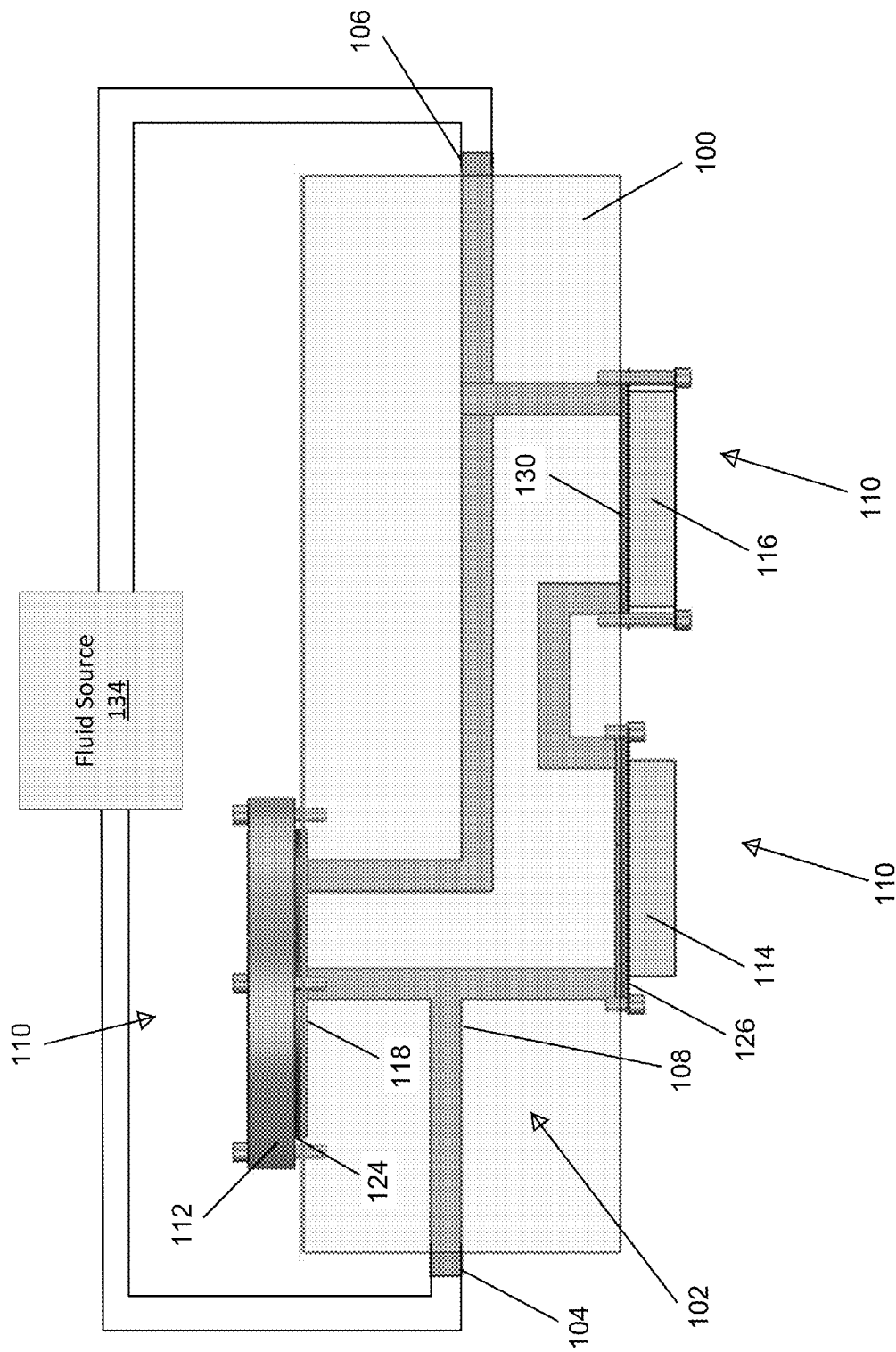
FIG. 1A depicts side view of a plastic chassis used in a liquid cooling application according to embodiments.

Turning now to FIG. 1A, one embodiment of a plastic chassis 100 used to support electronic components in a liquid cooling application is shown. Chassis 100 may be formed from a plastic or similar insulator. For example, the plastic chassis may include ABS, thermal insulators, thermomelts, thermosets, ceramics, composites, a polymer having similar thermal and insulating properties as ABS, and/or combinations thereof. As just one example, chassis 100 may be formed from a polymer or other substance having a surface resistivity of at least $10^{10}$ ohms/square, with a surface resistivity exceeding $10^{14}$ ohms/square being preferable. In other embodiments, materials having thermal conductively of less than 1 W/mK, often less than 0.5 W/mK, and even more often less than 0.25 W/mK may be used to form chassis 100. Chassis 100 may be molded, fastened, 3D printed, and/or otherwise formed or assembled from one or more pieces.

Chassis 100 may include a fluid circuit 102 that extends through at least a portion of the chassis 100. In some embodiments, the fluid circuit 102 may be machined into the chassis 100, while in other embodiments, the fluid circuit 102 may be etched, 3D printed, molded, and/or otherwise formed in chassis 100. Fluid circuit 102 may include one or more fluid inlets 104, one or more fluid outlets 106, and at least one fluid conduit or channel 108 extending between the inlet 104 and the outlet 106. The fluid channel 108 may define a fluid path for a cooling fluid that is used to cool a number of electronic components 112, 114, and 116 that are coupled with the chassis 100 at a number of mounting sites 110. Each of the mounting sites 110 is in contact with the fluid channel 108 such that a cooling fluid passing through the fluid channel 108 directly and/or indirectly cools an electronic component.

Figure 1B:
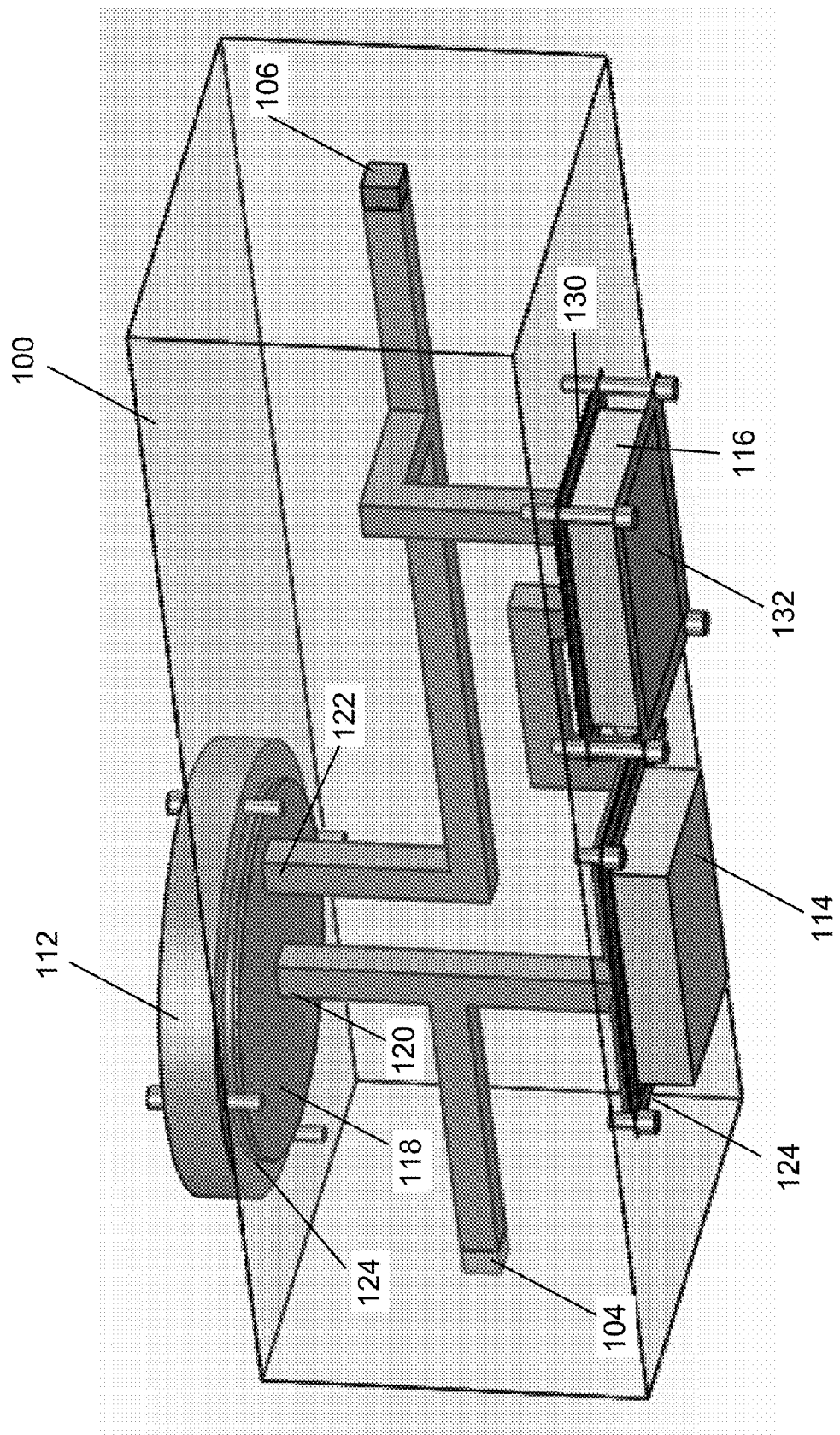
FIG. 1B depicts a bottom isometric view of the plastic chassis used in a liquid cooling application of FIG. 1A according to embodiments.

For example, electronic component 112 may be directly cooled as shown in FIG. 1B. This may include positioning a fluid reservoir 118 at the mounting site 110 that includes a reservoir inlet 120 and a reservoir outlet 122. The reservoir inlet 120 may be in fluid communication with an inlet side of the fluid channel 108 and the reservoir outlet 122 may be in fluid communication with an outlet side of the fluid channel 108 such that, when introduced to the fluid circuit 102, the cooling fluid fills the reservoir 118 and directly cools the particular one of the plurality of mounting sites and electronic component 112. This may involve an underside of the electronic component 112 being at least partially submerged within the cooling fluid in the reservoir 118. In some embodiments, a peripheral seal 124 may be positioned around an outer periphery of the reservoir 118 to help prevent the cooling fluid from leaking from the interface of the electronic component 112 and the reservoir 118.

As another example shown in FIG. 1C, electronic component 114 may be mounted on an intermediate cooled plate 126, which may be part of a mounting site 110. The intermediate cooled plate 126 may be formed of a metal, such as aluminum, or other conductor. The use of a conducting plate helps draw or conduct heat from the electronic components to the fluid channel 108. In such embodiments, the intermediate cooled plate 126 may be in contact with a portion of the fluid channel 108. The fluid channel 108 may contact all or part of an underside of the intermediate cooled plate 126 such that as fluid passes through the portion of fluid channel 108 that contacts the intermediate cooled plate 126, heat from the electronic component 114 passes through the intermediate cooled plate 126 and is dissipated within the cooling fluid, thereby cooling the electronic component 114. As just one example, the fluid channel 108 may contact at least 50% of a surface area of a side of the intermediate cooled plate 126, while in other embodiments, over 90% or 99% of the surface area of a side of the intermediate cooled plate 126 may be in contact with a portion of the fluid channel 108.

As another example, electronic component 116 may be cooled through a thermal pad 128 to an intermediate plate 130, which may be similar to intermediate cooling plate 126 and may be a part of a mounting site 110. Thermal pad 128 may be in fluid communication with the fluid channel 108, which may direct a cooling fluid into an inlet side of the thermal pad 128 and remove the cooling fluid from an outlet side of the thermal pad 128. An intermediate plate 130 may be positioned adjacent the thermal pad 128 and electronic component 116, such as a printed circuit board (PCB), may be mounted to the intermediate plate 130. In some embodiments, an additional metal plate 132 or other mounting feature may be positioned at least partially atop the electronic component 116 to help secure the electronic component 116 on a mounting site 110.

In some embodiments, chassis 100 may include two or more fluid channels 108. For example, a first fluid channel and a second fluid channel may extend between the inlet and the outlet in a parallel arrangement according to general electronic circuitry principles, with each channel cooling a different set of electronic components. This enables electronic components to be easily mounted on multiple sides of the chassis 100. In some embodiments, each fluid channel 108 includes a separate inlet 104 and/or outlet 106 while in other embodiments, one or more fluid channels 108 may share one or more inlets 104 and/or outlets 106. For example, two fluid channels 108 may originate from a single inlet 104, with the fluid channels diverging at a fork, such as a T-junction. In some embodiments, one or more fluid channels 108 may be arranged in series, with a cooling fluid flowing through a fluid channel 108 first cooling one component and then cooling a second component further down the fluid channel 108.

In some embodiments, the fluid channel includes a cooling section on a first inlet side of each mounting site and a return section on the other outlet side of each mounting site. Each cooling section is configured to receive cooling fluid from a fluid source 134 to cool an electrical component that is coupled with the particular mounting site. Each return section is configured to receive fluid after the fluid has been warmed by the electrical component. The warmed fluid may then be used to cool another electronic component, such as a less critical and/or less heat sensitive component downstream of the first component, such as in a series configuration. The warmed fluid may also be returned to the fluid source to be cooled and reintroduced to the fluid circuit 102 to further cool the electronic system.

In some embodiments, at least a portion of each of the cooling section (inlet side) and the return section (outlet side) of the same and/or different fluid channels 108 are positioned within about 6 inches of one another. In some embodiments, the cooling section and return section may be within about 2 inches, within about 1 inch, or within about 0.25 inches from one another, while in other embodiments, even smaller distances may be utilized. Oftentimes, this may be done by running portions of one or more fluid channels parallel to or substantially parallel (within about 20 degrees of parallel) to one another. Similarly, an inlet of one fluid channel and an outlet from a different fluid channel may be placed within a similar distance of one another. In some embodiments, a fluid channel may be positioned within about 6 inches of an electronic component not cooled by that particular fluid channel, although smaller distances, such as within 2, 1, 0.5, 0.25, or smaller may be achieved. In some embodiments, at least a portion of a fluid channel 108 is positioned at least substantially parallel to a longitudinal axis of the plastic chassis 100 and within about 6 inches from an outer surface of the plastic chassis 100, although smaller distances, such as within 2, 1, 0.5, 0.25, or smaller may be achieved. The use of a plastic chassis ensures that any combination of positions of fluid channels, inlets, outlets, cooling sides, return sides, and electronic components may be used without running the risk of thermal short circuits. Such distances and arrangements are typically not be possible with metal chassis as the closeness of the cooling and returns sections may lead to thermal short circuits.

Fluid source 134 may be any source of fluid typically used in liquid coolant systems, such as cooling pumps. Fluid source 134 is often positioned outside of the chassis 100 and coupled with each of the inlets and outlets. Fluid source 134 may pump or otherwise circulate the cooling fluid throughout the fluid circuit 102 to cool each of the components. In some embodiments, the cooling fluid may be cooled by the environment outside of the chassis 100 on its return to fluid source 134, while in other embodiments, fluid source 134 includes and/or is coupled with an active cooling mechanism to cool the fluid after it has been heated by the electronic components. In some embodiments, there may be multiple fluid sources, with each source supporting one or more sets of inlets and outlets. Possible cooling fluids may include, without limitation, water, antifreeze, ethylene glycol, oils, freons, dielectric liquids, other fluids, and/or combinations thereof.

It will be appreciated that other cooling techniques and mounting site designs may be used in accordance with the present invention. The channel, chassis, and mounting site designs described herein are provided only as examples. Different designs and mounting sites may be required based on the needs of a particular electrical component. For example, highly critical and/or highly heat sensitive components may require more aggressive forms of liquid cooling.

Figure 2:
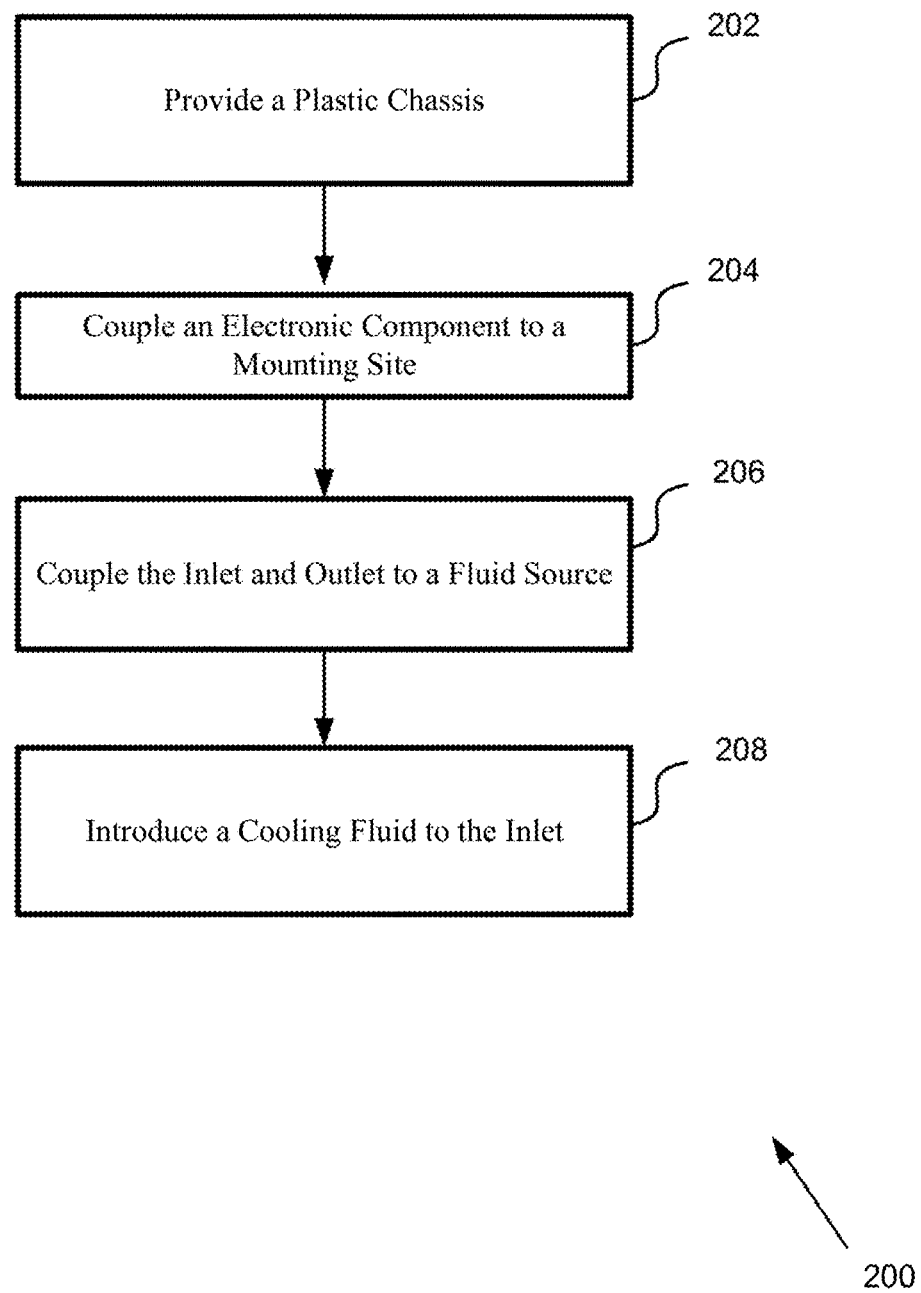
FIG. 2 is a flowchart of a process for liquid cooling electronic components according to embodiments.

FIG. 2 depicts a flowchart for one embodiment of a process 200 of liquid cooling electrical components. Process 200 may include providing a plastic chassis at block 202, such as those described in FIGS. 1A-1C. For example, the plastic chassis may have one or more mounting sites for a number of electronic components. The plastic chassis may define a fluid circuit that extends through at least a portion of a length of the plastic chassis, with the fluid circuit including at least one inlet, at least one outlet, and at least one fluid channel extending between the inlet and the outlet. Each of the mounting sites is in contact with the fluid channel, which allows a cooling fluid flowing through the fluid channel to cool electronic components coupled with the mounting sites.

Process 200 may also include coupling an electrical component to the mounting site at block 204. For example, a computer processor or other electronic component may be coupled to each mounting site. In some embodiments, a metal plate may be positioned on the mounting site before coupling the electrical component to the mounting site such that the fluid channel directly cools the metal plate and indirectly cools the electrical component. In other embodiments, when coupled with the electrical component, the mounting forms a fluid reservoir in fluid communication with the fluid channel such that the cooling fluid is in direct contact with an underside of the electrical component. Oftentimes, a seal may be positioned around an outer periphery of the fluid reservoir. For example, a gasket formed of rubber or other synthetic material may be used to seal the fluid reservoir.

In some embodiments, multiple components, such as a set of similar components having similar cooling needs may be coupled with a single mounting site. At block 206, the inlet and the outlet of the fluid circuit may be coupled to a fluid source that is external to the plastic chassis. A cooling fluid may be introduced from the fluid source to the inlet at block 208 such that the cooling fluid passes through the fluid channel and contacts an inlet side of the mounting site where the cooling fluid cools the electrical component by absorbing heat from the electrical component before flowing past the mounting site on a return side of the mounting site. The heated cooling fluid may then exit the plastic chassis via the outlet and returning to the fluid source. Cooling fluids may include, without limitation, water, antifreeze, ethylene glycol, oils, freons, dielectric liquids, other fluids, and/or combinations thereof.

Process 200 may also include coating at least a portion of an outer surface of the plastic chassis with a radio frequency (RF) shielding material. For example, the chassis may be powder coated, foil wrapped, or otherwise coated with the RF shielding material to provide RF shielding properties of some metal chassis while still providing the benefits of plastic described herein. In some embodiments, other RF barriers, such as metal plates, may be positioned between electronic components to shield the components from RF signals emitted from other components.

It will be appreciated that process 200 may include any number of fluid circuits, channels, inlets, and outlets, mounting sites, and/or electronic components. In some embodiments, only a single method of liquid cooling may be utilized in the plastic chassis, while in other embodiments, multiple forms of liquid cooling may be implemented in a single chassis.

It should be noted that the systems and devices discussed above are intended merely to be examples. It must be stressed that various embodiments may omit, substitute, or add various procedures or components as appropriate. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known structures and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A system for mounting liquid cooled electrical components, the system comprising:
   a plastic chassis comprising a plurality of mounting sites, the plastic chassis defining at least one fluid circuit that extends through at least a portion of a length of the plastic chassis, wherein the at least one fluid circuit comprises:
      an inlet configured to receive a cooling fluid from a fluid source;
      an outlet configured to return the cooling fluid to the fluid source; and
      at least one fluid channel extending between the inlet and the outlet; and
   a plurality of electrical components, wherein:
      each of the plurality of electrical components is coupled with one of the plurality of mounting sites;
      each of the plurality of mounting sites is in contact with the at least one fluid channel; and
      the plastic chassis is coated with a radio frequency (RF) shielding material.

2. The system for mounting liquid cooled electrical components of claim 1, wherein:
   a particular one of the plurality of mounting sites comprises a fluid reservoir;
   the fluid reservoir comprising a reservoir inlet and a reservoir outlet;
   the reservoir inlet is in fluid communication with an inlet side of the at least one fluid channel; and
   the reservoir outlet is in fluid communication with an outlet side of the at least one fluid channel such that the cooling fluid directly cools the particular one of the plurality of mounting sites and a corresponding one of the plurality of electrical components that is coupled with the particular one of the plurality of mounting sites.

3. The system for mounting liquid cooled electrical components of claim 1, wherein:
   the at least one fluid channel comprises a first fluid channel and a second fluid channel; and
   the first fluid channel and the second fluid channel extend between the inlet and the outlet in a parallel arrangement.

4. The system for mounting liquid cooled electrical components of claim 1, wherein:
   the at least one fluid channel comprises a first fluid channel and a second fluid channel; and
   the first fluid channel and the second fluid channel extend between the inlet and the outlet in a series arrangement.

5. The system for mounting liquid cooled electrical components of claim 1, wherein:
   the at least one fluid channel comprises a section that is positioned adjacent at least one of the plurality of mounting sites.

6. The system for mounting liquid cooled electrical components of claim 5, wherein:
   the section contacts at least 50% of a surface area of a surface of the at least one of the plurality of mounting sites that is adjacent the section.

7. The system for mounting liquid cooled electrical components of claim 1, wherein:
the at least one fluid channel comprises a cooling section on a first side of a particular one of the plurality of mounting sites and a return section on a second side of the particular one of the plurality of mounting sites, the cooling section being configured to receive cooled fluid from the fluid source to cool a corresponding one of the plurality of electrical components that is coupled with the particular one of the plurality of mounting sites, the return section being configured to receive fluid after the fluid has been warmed by the corresponding one of the plurality of electrical components; and
at least a portion of each of the cooling section and the return section are positioned within about 6 inches from one another.

8. A system for mounting liquid cooled electrical components, the system comprising:
a plastic chassis comprising a plurality of mounting sites, the plastic chassis defining at least one fluid circuit that extends through at least a portion of a length of the plastic chassis, wherein the at least one fluid circuit comprises:
an inlet configured to receive a cooling fluid from a fluid source;
an outlet configured to return the cooling fluid to the fluid source;
a first fluid channel; and
a second fluid channel, the first fluid channel and the second fluid channel each extending between the inlet and the outlet in a parallel configuration; and
a plurality of electrical components, wherein:
each of the plurality of electrical components is coupled with one of the plurality of mounting sites;
each of the plurality of mounting sites is in contact with the at least one fluid channel; and
the plastic chassis is coated with a radio frequency (RF) shielding material.

9. The system for mounting liquid cooled electrical components of claim 8, wherein:
the second fluid channel is coupled with a first mounting site and a second mounting site of the plurality of mounting sites in a series configuration such that fluid passing through the second fluid channel first passes and cools a first one of the plurality of electrical components that is coupled with the first mounting site before then passing and cooling a second one of the plurality of electrical components that is coupled with the second mounting site.

10. The system for mounting liquid cooled electrical components of claim 8, wherein:
at least a portion of the first fluid channel is positioned at least substantially parallel to a longitudinal axis of the plastic chassis and within about 6 inches from an outer surface of the plastic chassis.

11. The system for mounting liquid cooled electrical components of claim 8, wherein:
the plastic chassis comprise a polymer having a surface resistivity of at least $10^{10}$ ohms/square.

12. The system for mounting liquid cooled electrical components of claim 8, wherein:
the plastic chassis comprises ABS.

13. The system for mounting liquid cooled electrical components of claim 8, wherein:
a cooling side of the first fluid channel is within about 6 inches of a return side of one or both of the first fluid channel and the second fluid channel.

14. A method for liquid cooling electrical components, the method comprising:
providing a plastic chassis comprising a mounting site, the plastic chassis defining a fluid circuit that extends through at least a portion of a length of the plastic chassis, wherein the fluid circuit comprises:
an inlet;
an outlet; and
a fluid channel extending between the inlet and the outlet, wherein the mounting site is in contact with the fluid channel, wherein the plastic chassis is coated with a radio frequency (RF) shielding material;
coupling an electrical component to the mounting site;
coupling the inlet and the outlet to a fluid source that is external to the plastic chassis; and
introducing a cooling fluid from the fluid source to the inlet such that the cooling fluid passes through the fluid channel and contacts an inlet side of the mounting site where the cooling fluid cools the electrical component by absorbing heat from the electrical component before passing the mounting site on a return side of the mounting site, the heated cooling fluid then existing the plastic chassis via the outlet and returning to the fluid source.

15. The method for liquid cooling electrical components of claim 14, further comprising:
positioning a metal plate on the mounting site before coupling the electrical component to the mounting site such that the fluid channel directly cools the metal plate and indirectly cools the electrical component.

16. The method for liquid cooling electrical components of claim 14, wherein:
a portion of the fluid channel on an inlet side of the mounting site is within about 6 inches of an outer surface of the plastic chassis.

17. The method for liquid cooling electrical components of claim 14, wherein:
when coupled with the electrical component, the mounting forms a fluid reservoir in fluid communication with the fluid channel such that the cooling fluid is in direct contact with an underside of the electrical component; and
the method further comprises positioning a seal around an outer periphery of the fluid reservoir.

18. The method for liquid cooling electrical components of claim 14, wherein:
the cooling fluid comprises a dielectric liquid.

* * * * *